United States Patent [19]
Kurata

[11] Patent Number: 5,525,758
[45] Date of Patent: Jun. 11, 1996

[54] BUS BAR OF BRANCH JOINT BOX

[75] Inventor: Kazunori Kurata, Yokkaichi, Japan

[73] Assignee: Sumitomo Wiring Systems, Ltd., Yokkaichi, Japan

[21] Appl. No.: 61,576

[22] Filed: May 17, 1993

[30] Foreign Application Priority Data

May 29, 1992 [JP] Japan ................. 4-036512 U

[51] Int. Cl.⁶ ................................................ H01B 5/02
[52] U.S. Cl. ............................................... 174/133 B
[58] Field of Search ................... 174/133 R, 133 B,
174/119 R, 119 C, 126.4, 16.1, 16.2; 361/600,
611, 624, 637, 638, 639, 640

[56] References Cited

U.S. PATENT DOCUMENTS

| | | | |
|---|---|---|---|
| 3,886,654 | 6/1975 | Erdle | 24/624 |
| 3,957,142 | 5/1976 | Devolle | 174/133 BX |
| 4,142,224 | 2/1979 | Wilson et al. | 174/133.03 X |
| 5,068,491 | 11/1991 | Ogata et al. | 174/16.2 |

FOREIGN PATENT DOCUMENTS 1122513  5/1989  Japan .
0274114  3/1990  Japan .

Primary Examiner—Kristine L. Kincaid
Assistant Examiner—Christopher Horgan
Attorney, Agent, or Firm—Greenblum & Bernstein

[57] ABSTRACT

A bus bar of a branch joint box, which is formed by punching a metal sheet into a preset pattern of a circuit and is formed, at a predetermined location of the circuit, with a tab to be plated with metal having excellent electrical conductivity such that a connector of a wiring harness is connected to the tab through plug-in, including a separate bus bar portion which is formed by punching a separate metal sheet and includes the tab; wherein after the tab of the separate bus bar portion has been plated with the metal, the separate bus bar portion is inserted into a predetermined portion of the bus bar so as to be mounted on the bus bar.

7 Claims, 4 Drawing Sheets

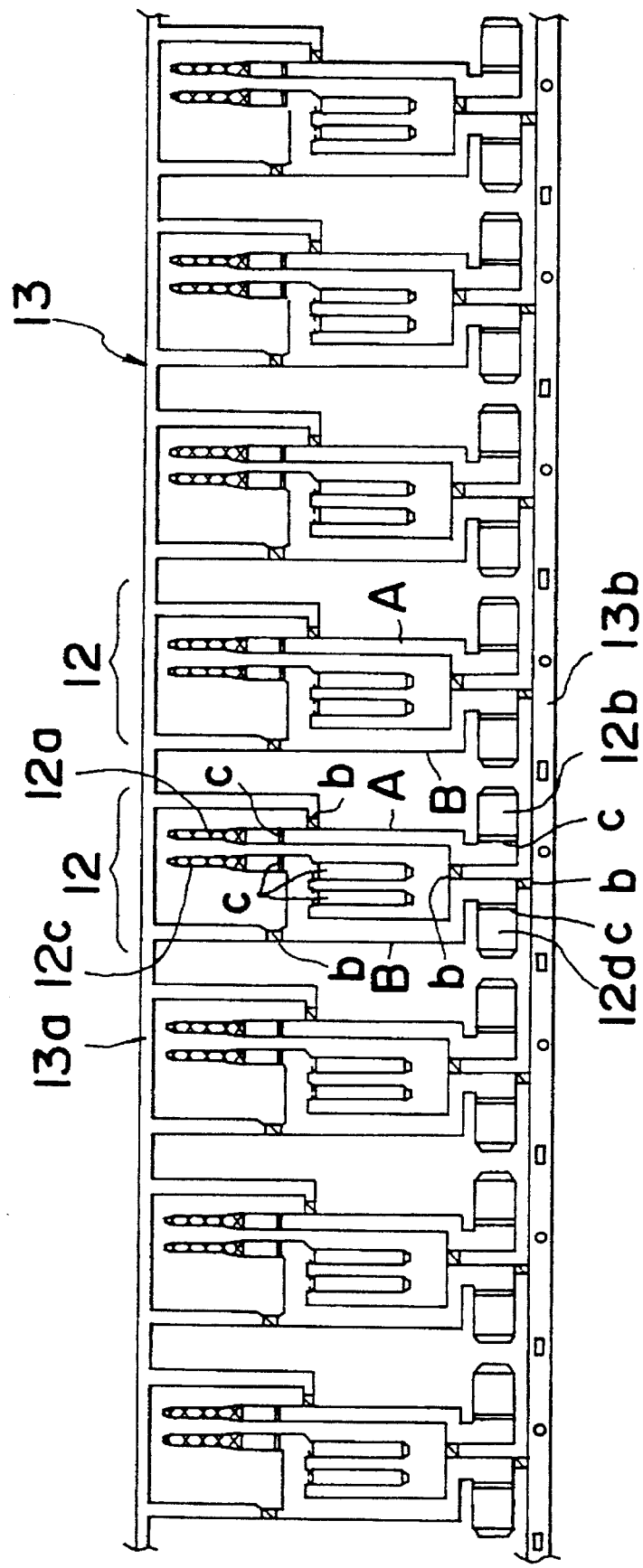

BUS BAR OF BRANCH JOINT BOX

BACKGROUND OF THE INVENTION

The present invention relates to a bus bar of a branch joint box for branching a circuit by connecting thereto connectors of wiring harnesses for a motor vehicle through plug-in means.

Conventionally, in a branch joint box (or junction box) used for joining branches of wiring harnesses for a motor vehicle to various automotive electrical apparatuses, branch joint points are concentrated at one spot so as to joint branches of wiring efficiently and economically. In response to recent trends towards higher density of the wiring harnesses, various types of branch joint boxes are proposed. In the branch joint boxes, a bus bar having tabs used for plug-in connection of connectors of the wiring harnesses is incorporated.

As shown in FIG. 1, a known bus bar 1 of this kind is formed by punching a metal sheet into a preset pattern of a circuit and by providing a number of tabs 1a at predetermined locations of the circuit. When the bus bar 1 is mounted on a substrate, the circuit is cut apart at locations a.

Usually, the known bus bar 1 is produced by punching a sheet of copper or the like. In the case of safety apparatuses mounted on the motor vehicle, for example, a supplemental restraint system (SRS) for supplementing a seat belt, such as an air bag system, two power supply lines, namely, a power source circuit A exclusively used for the SRS and an auxiliary power source circuit B acting also as another circuit are provided.

The power source circuits A and B have two juxtaposed tabs 1b, respectively. Electric current flowing through the tabs 1b from a power source is minute. Thus, in order to improve reliability of connection of the connectors, the tabs 1b are usually plated with metal having excellent electrical conductivity, for example, gold as shown by the crossed hatching. When this gold plating is performed on the tabs 1b, it is necessary to provide the power source circuits A and B at outer peripheral portions of the bus bar 1 and then, form the tabs 1b towards an outer periphery of the bus bar 1 such that the tabs 1b of the power source circuits A and B can be partially plated by hanging the bus bar 1.

However, rack type plating is expensive in which plating is performed by hanging the bus bar 1 one by one. Meanwhile, since circuit configurations of the bus bar 1 are different according to types of motor vehicles, plating facilities are required to be designed exclusively for the types of the motor vehicles, respectively. Furthermore, since the tabs 1b to be plated should be formed towards the outer periphery of the bus bar 1, such problems arise that coupling positions of the connectors are restricted and loss of material of the bus bar 1 is enormous.

SUMMARY OF THE INVENTION

Accordingly, an essential object of the present invention is to provide, with a view to eliminating the disadvantages inherent in conventional bus bars, a bus bar in which partial plating of necessary tabs can be performed easily and at low cost.

In order to accomplish this object of the present invention, a bus bar of a branch joint box, which is formed by punching a metal sheet into a preset pattern of a circuit and is formed, at a predetermined location of the circuit, with a tab to be plated with metal having excellent electrical conductivity such that a connector of a wiring harness is connected to the tab through plug-in, comprising: a separate bus bar portion which is formed by punching a separate metal sheet and includes the tab; wherein after the tab of the separate bus bar portion has been plated with the metal, the separate bus bar portion is inserted into a predetermined portion of the bus bar so as to be mounted on the bus bar.

In accordance with the present invention, the separate bus bar portion including the tab requiring plating is provided separately from the bus bar and is subsequently inserted into the bus bar so as to be mounted on the bus bar. Since a series of the separate bus bar portions can be formed by continuously punching the metal sheet, the tab of each of the separate bus bar portions can be plated continuously by a sequential feed type continuous plating facility in general use, thus resulting in remarkable reduction of plating cost.

Meanwhile, since the separate bus bar portion is subsequently inserted into the bus bar so as to be mounted on the bus bar, the tab of the separate bus bar portion is not required to be formed towards an outer periphery of the bus bar. As a result, restriction on a coupling position of the connector is obviated and loss of material of the bus bar is also lessened.

Furthermore, since the separate bus bar portion can be formed compactly, the bus bar can be applied to various types of motor vehicles, thereby resulting in improvement of general-purpose properties of the bus bar.

BRIEF DESCRIPTION OF THE DRAWINGS

This object and features of the present invention will become apparent from the following description taken in conjunction with the preferred embodiment thereof with reference to the accompanying drawings, in which:

FIG. 4 is a top plan view of a series of separate bus bars used for the bus bar of FIG. 2.

DETAILED DESCRIPTION OF THE INVENTION

Figure 1:
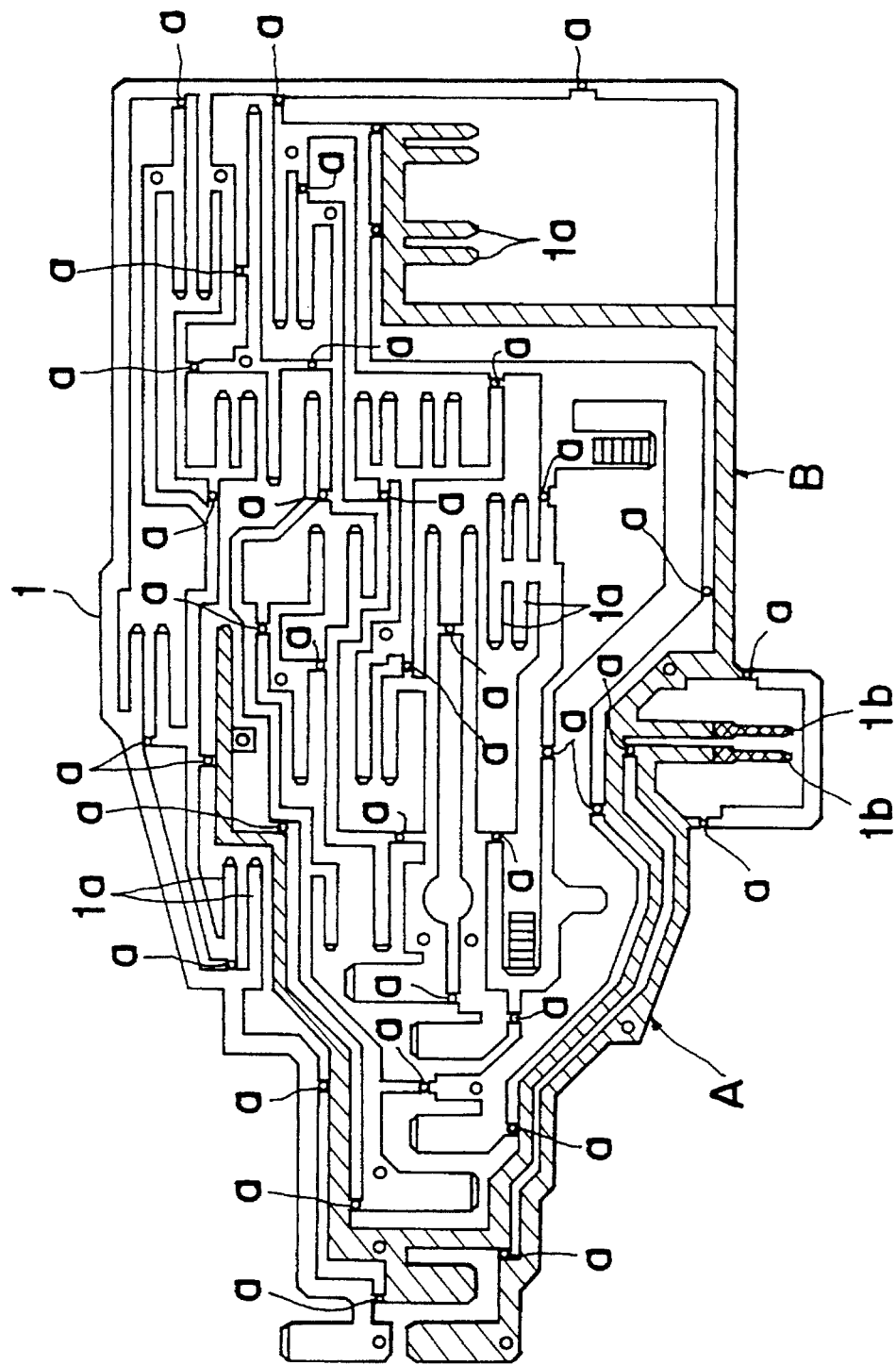
FIG. 1 is a top plan view of a prior art bus bar referenced.
Figure 2:
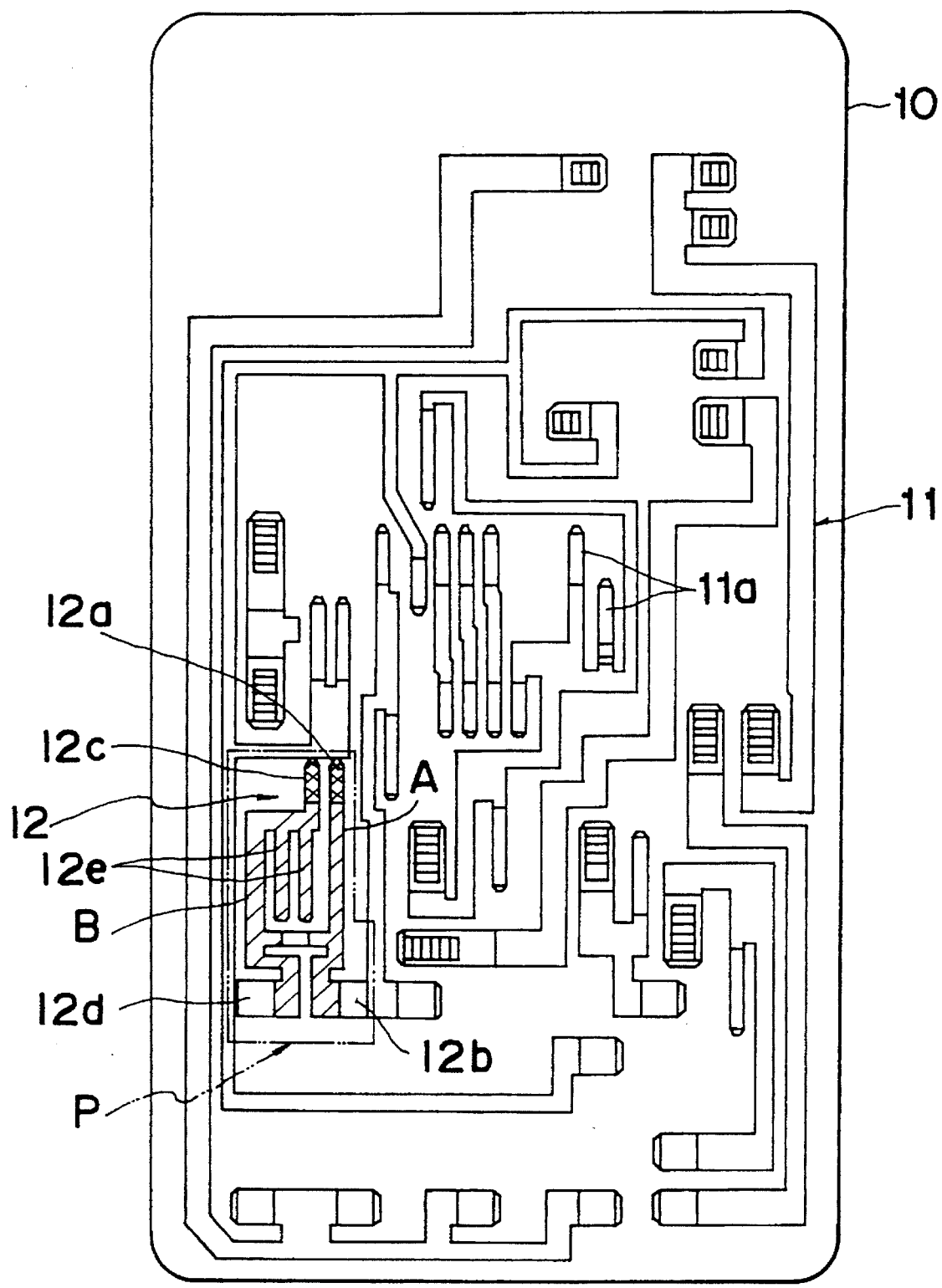
FIG. 2 is a top plan view showing a bus bar according to the present invention after having been punched.

Referring now to the drawings, there is shown in FIG. 2, a bus bar 11 according to the present invention. The bus bar 11 is mounted on a substrate 10 incorporated in a branch joint box. The bus bar 11 is formed by punching a metal sheet of copper or the like into a preset pattern of a circuit and by providing a number of tabs 11a at predetermined locations of the circuit. Connectors of wiring harnesses for a motor vehicle are connected to the tabs 11a through plug-in. Two power supply lines for an SRS (supplemental restraint system), i.e., a power supply circuit A exclusively used for the SRS and an auxiliary power source circuit B acting also as another circuit are provided at a predetermined portion P enclosed by the two-dot chain lines in FIG. 2.

In the power source circuit A, tabs 12a and 12b are provided for a connector and a fuse of a wiring harness of the SRS, respectively. Meanwhile, in the power source circuit B, tabs 12c, 12d and a pair of tabs 12e are, respectively, provided for a connector, a fuse and terminal circuits of another wiring harness of the SRS. The terminal circuits act also as other circuits. In the power source circuits A and B, the tabs 12a and 12c for the connectors are juxtaposed in parallel with each other. The tabs 12a and 12c for the connectors, the tabs 12b and 12d for the fuses and the tabs 12e for the terminal circuits are laid out compactly so as to be contained in the predetermined portion P.

On the other hand, as shown in FIG. 4, a band-like metal sheet 13 is provided additionally. The metal sheet 13 is punched continuously so as to be formed with a series of separate bus bars 12 each having the power source circuit A exclusively used for the SRS and the auxiliary power source B such that each of the separate bus bars 12 is contained in the predetermined portion P. At the time of punching of the metal sheet 13, the separate bus bars 12 are not detached from the metal sheet 13 but are coupled with each other through a protective guide 13a at one side of the metal sheet 13 adjacent to the tabs 12a and 12c and through a feed guide 13b at the other side of the metal sheet 13 adjacent to the tabs 12b and 12d. When each of the separate bus bars 12 is mounted on the substrate 10, each of the separate bus bars 12 is detached from the guides 13a and 13b at locations b. Meanwhile, each of the separate bus bars 12 is bent at locations c.

The crossed hatching portions of the tabs 12a and 12c of the band-like metal sheet 13 formed with the separate bus bars 12 by punching is plated with gold having excellent electrical conductivity. To this end, after the remaining portion of the metal sheet 13 has been masked by a masking jig, the metal sheet 13 is plated with gold continuously by a sequential feed type continuous plating facility in general use. Subsequently, the band-like metal sheet 13 is wound around a reel and is transported to an assembly line. Since the metal sheet 13 is formed with the guides 13a and 13b as described above, deformation of the tabs 12a to 12d of each of the separate bus bars 12 can be prevented effectively when the metal sheet 13 is wound around the reel.

By the above described arrangements of the bus bar 11 and the metal sheet 13, the bus bar 11 which does not have the power source circuit A exclusively used for the SRS and the auxiliary power source circuit B at the predetermined portion P is initially placed on the substrate 10 at the assembly line. Then, the locations c of each of the separate bus bars 12 of the metal sheet 13 are bent alongside of the assembly line and each of the separate bus bars 12 is subsequently inserted into the predetermined portion P of the bus bar 11 so as to be mounted on the bus bar 11. Thereafter, the bus bar 11 and the separate bus bar 12 are cut apart at locations (not shown) and the locations b, respectively simultaneously and are mounted on the substrate 10 by caulking.

Figure 3:
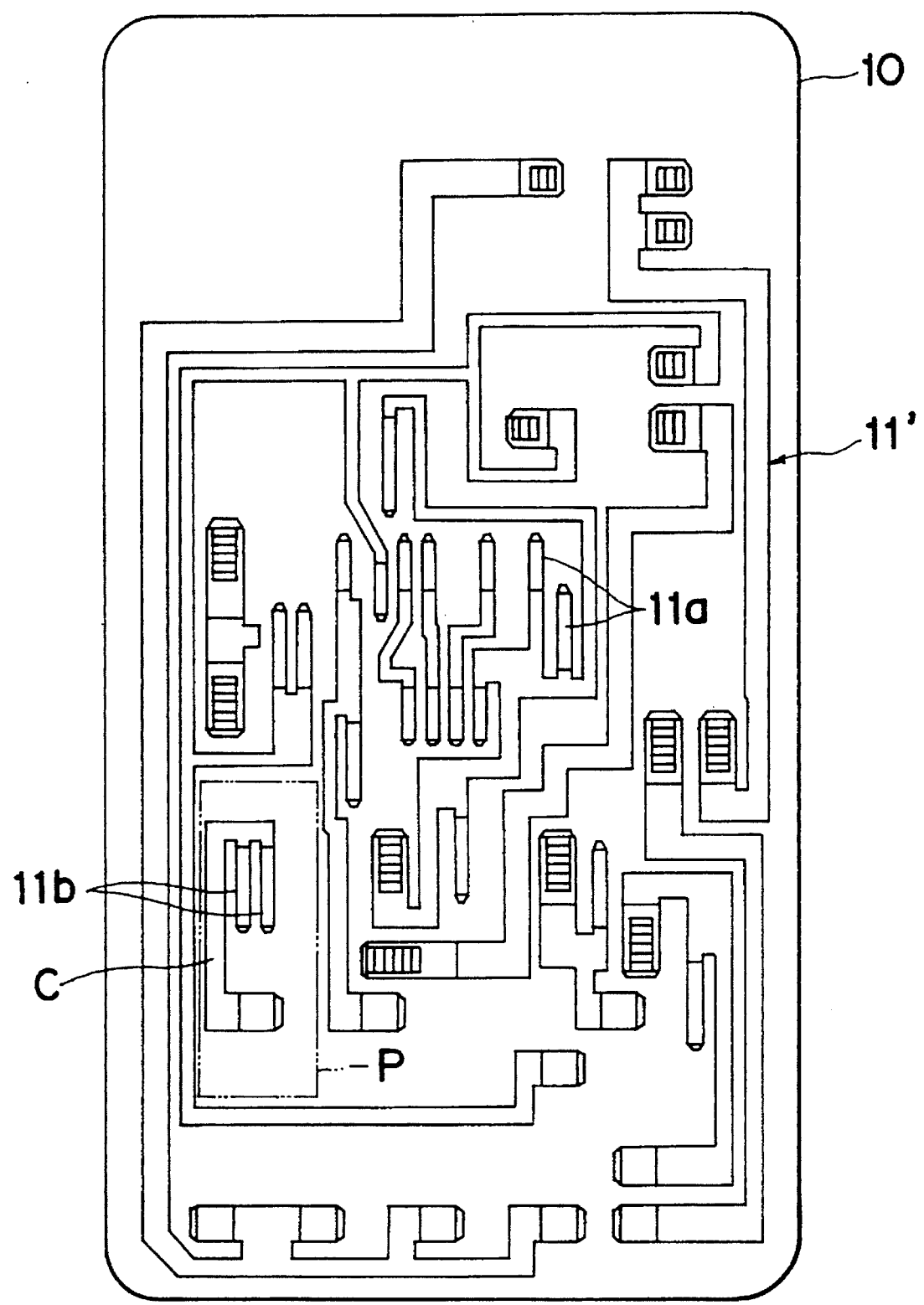
FIG. 3 is a view similar to FIG. 2, particularly showing its modification.

FIG. 3 shows a bus bar 11' which is a modification of the bus bar 11 of FIG. 2 and does not require the power source circuits A and B. In the bus bar 11', for example, a power source circuit C for a fuel pump is provided at the predetermined portion P of the bus bar 11'. Since tabs 11b of this power source circuit C are not required to be plated with gold, the power source circuit C may be formed integrally with the bus bar 11'.

In case the power source circuits A and B should be provided in the bus bar 11', the power source circuit C at the predetermined portion C is detached from the bus bar 11' at the time of punching of the bus bar 11' and the separate bus bar 12 is subsequently inserted into the predetermined portion P of the bus bar 11' so as to be mounted on the bus bar 11' in the same manner as in the bus bar 11.

As described above, the power source circuits A and B of the separate bus bar 12 having the tabs 12a and 12c plated with gold preliminarily are subsequently inserted into the predetermined portion P of the bus bar 11 so as to be mounted on the bus bar 11. Thus, since a series of the separate bus bars 12 each having the power source circuits A and B can be formed by punching the band-like metal sheet 13, the tabs 12a and 12c of each of the separate bus bars 12 can be plated continuously by the sequential feed type continuous plating facility in general use, thereby resulting in great reduction of plating cost.

Meanwhile, since the power source circuits A and B of the separate bus bar 12 can be subsequently inserted into the predetermined portion P of the bus bar 11 so as to be mounted on the bus bar 11, the tabs 12a and 12c of the bus bar 12, which are to be plated with gold, are not required to be formed towards an outer periphery of the bus bar 11. Thus, restriction on coupling positions of the connectors is obviated and loss of material of the bus bar 11 is reduced. Furthermore, since the separate bus bar 12 can be formed compactly, the bus bar 11 can be applied to various types of motor vehicles as shown in FIG. 3, thereby resulting in improvement of general-purpose properties of the bus bar 11.

As is clear from the foregoing description of the bus bar of the branch joint box, according to the present invention, the circuit having the tabs to be plated is provided separately from the remaining circuit of the bus bar and is subsequently inserted into the remaining circuit of the bus bar so as to be mounted on the bus bar. Therefore, the tabs of the circuit of the separate bus bar can be plated continuously by the successive feed type continuous plating facility in general use, thereby resulting in sharp reduction of plating cost.

Meanwhile, the circuit of the separate bus bar can be subsequently inserted into the remaining circuit of the bus bar so as to be mounted on the bus bar. Therefore, the tabs of the separate bus bar, which are to be plated, are not required to be formed towards the outer periphery of the bus bar. Hence, restriction on coupling positions of the connectors is eliminated and loss of material of the bus bar is lessened.

Furthermore, since the separate bus bar can be formed compactly, the bus bar can be applied to various types of motor vehicles, thus resulting in improvement of general-purpose properties of the bus bar.

What is claimed is:

1. A bus bar of a branch joint box, which is formed by punching a metal sheet into a preset pattern of a circuit and is formed, at a predetermined location of the circuit, with a tab to be plated with metal having excellent electrical conductivity such that a connector of a wiring harness is connected to the tab through at least one connector, comprising:

a separate bus bar portion which is separate from said circuit and which is formed by punching a separate metal sheet and includes said tab, said tab having a width which is smaller than the width of said separate bus bar portion;

wherein after said tab of said separate bus bar portion has been plated with the metal, said separate bus bar portion is inserted into a predetermined portion of the bus bar so as to be mounted on the bus bar.

2. A bus bar as claimed in claim 1, wherein the metal is gold.

3. A method of forming a bus bar of a branch joint box, said bus bar having a preset circuit pattern and at least one tab at a predetermined location on the circuit pattern, the method comprising the steps of:

punching a first metal sheet into a first bus bar portion having at least a portion of the preset circuit pattern;

punching a separate second metal sheet into a separate second bus bar portion which includes said at least one tab;

plating, independently of said first metal sheet, said at least one tab with a metal having excellent electrical conductivity; and inserting said separate second bus bar portion into a predetermined portion of said first bus bar portion, after said plating.

4. A method of forming a bus bar as claimed in claim 3, wherein said metal is gold.

5. A method of forming a bus bar as claimed in claim 3, further comprising connecting a wiring harness to said at least one tab.

6. A method of claim 3, further comprising forming a series of separate bus bar portions by continuously punching at least one of said first or said second metal sheets.

7. A method of claim 6, further comprising plating at least one tab of each of said separate bus bar portions by a sequential feed type continuous plating system.

* * * * *